United States Patent [19]

Shima et al.

[11] Patent Number: 4,486,827
[45] Date of Patent: Dec. 4, 1984

[54] MICROPROCESSOR APPARATUS

[75] Inventors: Masatoshi Shima, Santa Clara; Federico Faggin, Cupertino; Ralph K. Ungermann, Los Altos, all of Calif.

[73] Assignee: Zilog, Inc., Campbell, Calif.

[21] Appl. No.: 340,470

[22] Filed: Jan. 18, 1982

Related U.S. Application Data

[62] Division of Ser. No. 092,827, Nov. 9, 1979, Pat. No. 4,332,008, which is a division of Ser. No. 665,228, Mar. 9, 1976, abandoned.

[51] Int. Cl.³ .............................................. G06F 9/00
[52] U.S. Cl. ................................................. 364/200
[58] Field of Search ............................... 364/200, 900

[56] References Cited

U.S. PATENT DOCUMENTS 3,969,724 7/1976 Anderson et al. ............... 364/200

Primary Examiner—Felix D. Gruber
Assistant Examiner—John G. Mills
Attorney, Agent, or Firm—Majestic, Gallagher, Parsons & Siebert

[57] ABSTRACT

A special reset function is provided in the CPU, using the same control input to the CPU as the normal reset, to reset only the program counter to facilitate the use of a single CPU in a microprocessor development system.

7 Claims, 14 Drawing Figures

CPU BLOCK DIAGRAM

CPU REGISTER CONFIGURATION

MINIMUM COMPUTER SYSTEM

ROM & RAM IMPLEMENTATION EXAMPLE

BASIC CPU TIMING EXAMPLE

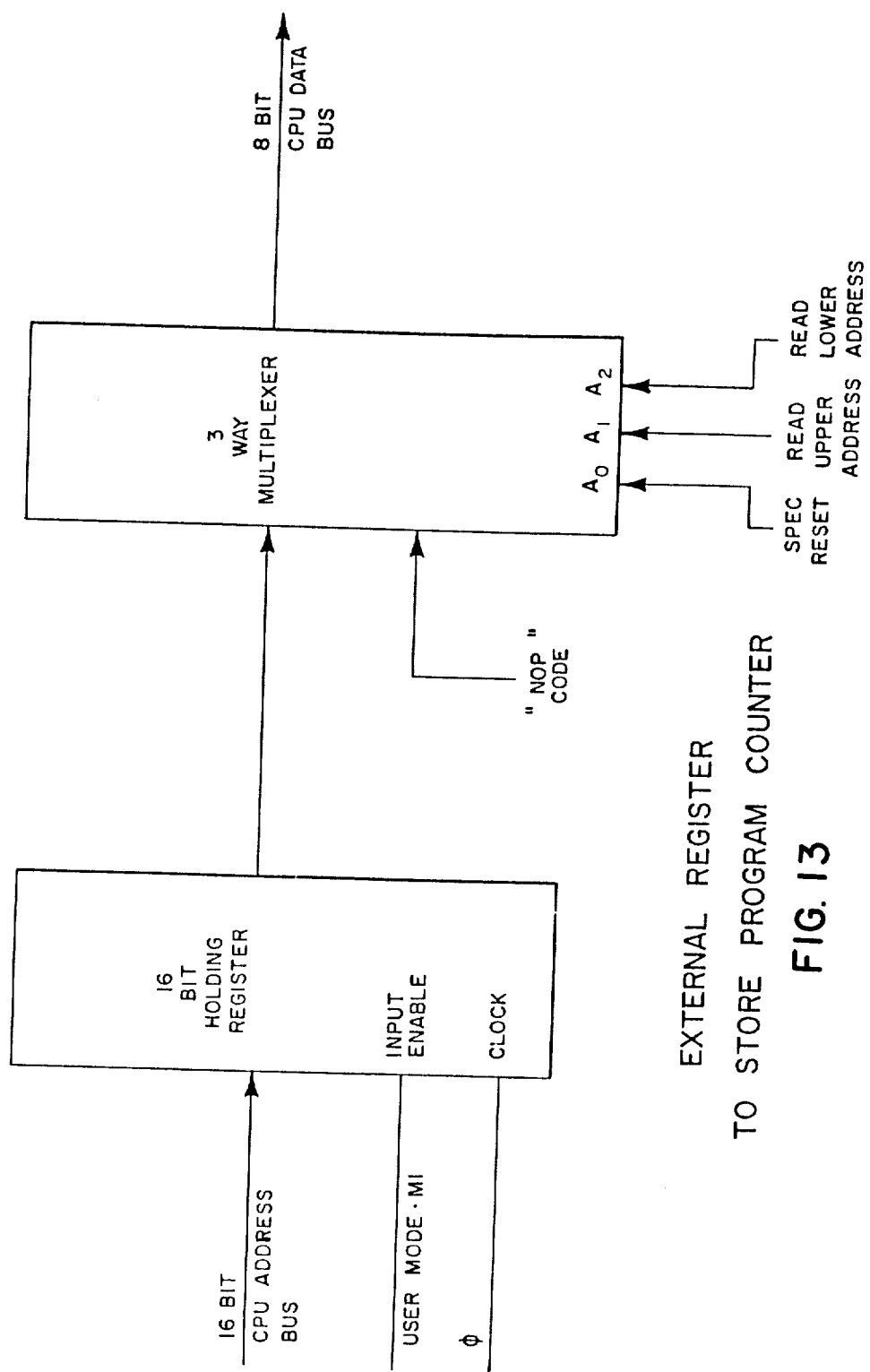

MICROPROCESSOR APPARATUS

This is a division of application Ser. No. 092,827, filed Nov. 9, 1979, U.S. now Pat. No. 4,332,008, which in turn is a division of application Ser. No. 665,228, filed Mar. 9, 1976, now abandoned.

BACKGROUND OF THE INVENTION

The present invention ganerally relates to digital processor apparatus and more particularly to digital microprocessor apparatus using MOS (metal-oxide semiconductor) LSI (large scale integration) technology. While the preferred embodiments are described with respect to an MOS LSI microprocessor, it will be understood by those of ordinary skill in the art that the invention is applicable generally to digital processing.

A microprocessor system typically includes a central processor unit (CPU), memory subsystem and input-/output subsystem to permit the system to communicate with the outside world.

More detailed descriptions of prior art microprocessors are found in "Microprocessor," *McGraw-Hill Yearbook of Science and Technology* 1974, McGraw-Hill, Inc., New York, 1974, pp. 272-275; "Components: microprocessors galore," *IEEE Spectrum, January*, 1976, pp. 50-56; "Self-contained microcomputers ease system implementation," *IEEE Spectrum, December*, 1974, p. 53; and "Computer Interfacing: Anatomy of a Microcomputer," *Computer Design*, February 1976, pp. 129,130. All of the above citations are hereby incorporated by reference.

SUMMARY OF THE INVENTION

According to one aspect of the present invention, briefly, the CPU includes a special reset function so that a single CPU can be employed to handle both the user (or emulator) and monitor (or integrator) functions in a microprocessor product development system. Prior art development systems have included two or more CPU's and associated logic and memory space to permit this function. With the present special reset function the CPU only resets the program counter when the system switches to the monitor mode, and an external register holds the last user address (program counter), thus preserving the program counter contents. The same CPU input that receives the normal reset also receives the special reset, thus requiring no additional pins in the case of a CPU contained in an LSI chip.

The various advantages and details of the present invention will be better appreciated as the accompanying detailed description and accompanying drawings are read and understood.

BRIEF DESCRIPTION OF THE DRAWINGS

FIG. 13 is a block diagram showing the external program counter register for use in the present invention.

DESCRIPTION OF THE PREFERRED EMBODIMENTS

Figure 1:
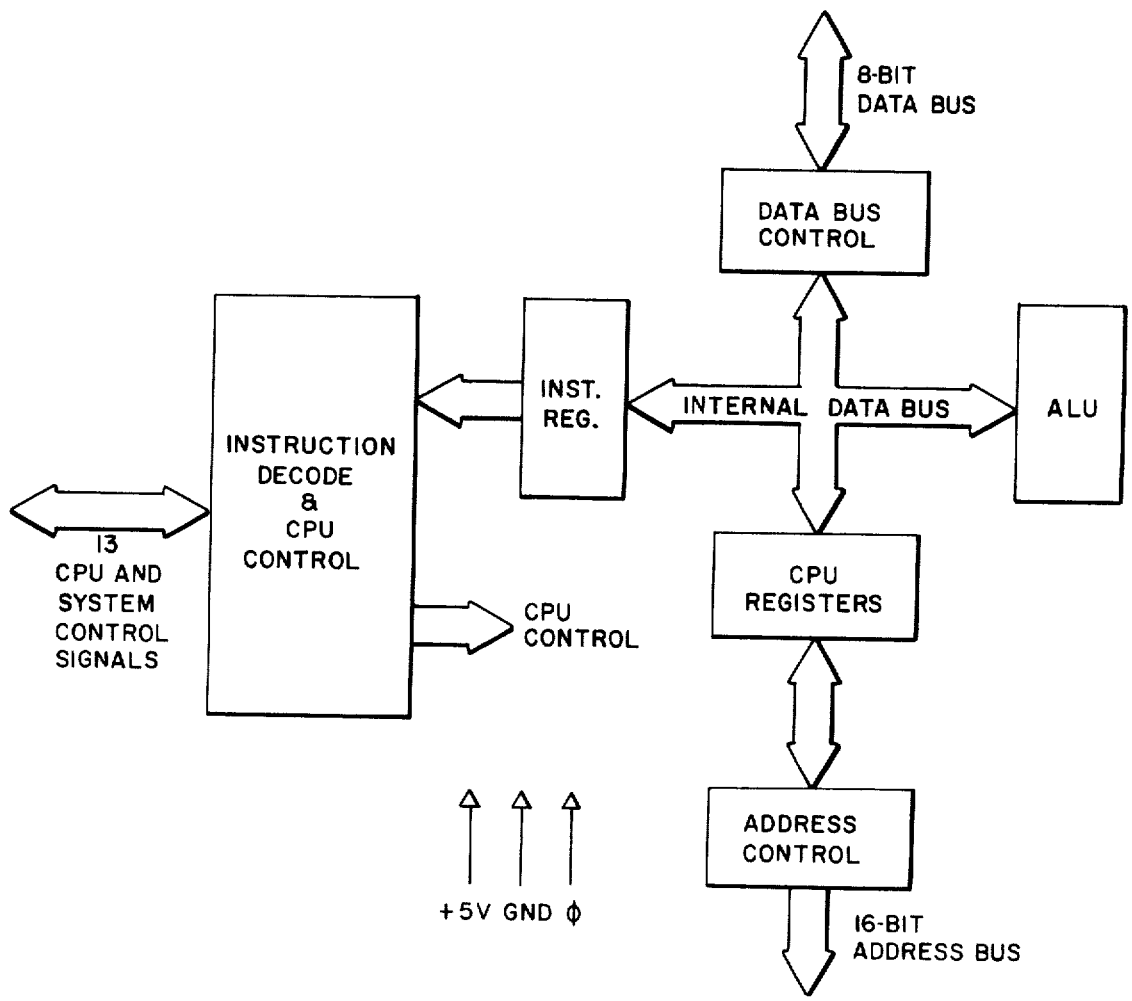
FIG. 1 is a block diagram of a typical central processor unit (CPU) used in digital processing.

A basic element related to the present invention is the central processor unit (CPU), referred to herein occasionally as the "Zilog Z-80 CPU", the designation under which it is to be sold.

The term "microcomputer" has been used to describe virtually every type of small computing device designed within the last few years. This term has been applied to everything from simple "microprogrammed" controllers constructed out of TTL MSI up to low end minicomputers with a portion of the CPU constructed out of TTL LSI "bit slices." However, the major impact of the LSI technology within the last few years has been with MOS LSI. With this technology, it is possible to fabricate complete and very powerful computer systems with only a few MOS LSI components.

The Zilog Z-80 family of components is a significant advancement in the state-of-the art of microcomputers. These components can be configured with any type of standard semiconductor memory to generate computer systems with an extremely wide range of capabilities. For example, as few as two LSI circuits and three standard TTL MSI packages can be combined to form a simple controller. With additional memory and I/O devices a computer can be constructed with capabilities that only a minicomputer could previously deliver. This wide range of computational power allows standard modules to be constructed by a user that can satisfy the requirements of an extremely wide range of applications.

The major reason for MOS LSI domination of the microcomputer market is the low cost of these few LSI components. For example, MOS LSI microcomputers have already replaced TTL logic in such applications as terminal controllers, peripheral device controllers, traffic signal controllers, point of sale terminals, intelligent terminals and test systems. In fact the MOS LSI microcomputer is finding its way into almost every product that now uses electronics and it is even replacing many mechanical systems such as weight scales and automobile controls.

The MOS LSI microcomputer market is already well established and new products using them are being developed at an extraordinary rate. The Zilog Z-80 component set has been designed to fit into this market through the following factors:

1. The Z-80 is fully software compatible with the popular 8080A CPU offered from several sources. Existing designs can be easily converted to include the Z-80 as a superior alternative.
2. The Z-80 component set is superior in both software and hardware capabilities to any other microcomputer system on the market. These capabilities provide the user with significantly lower hardware and software development costs while also allowing him to offer additional features in his system.
3. A complete product line including full software support with strong emphasis on high level languages and a disk-based development system with advanced real-time debug capabilities is offered to enable the user to easily develop new products.

Microcomputer systems are extremely simple to construct using Z-80 components. Any such system consists of three parts:

1. CPU (Central Processing Unit)
2. Memory
3. Interface Circuits to peripheral devices The CPU is the heart of the system. Its function is to obtain instructions from the memory and perform the desired operations. The memory is used to contain instructions and in most cases data that is to be processed. For example, a typical instruction sequence may be to read data from a specific peripheral device, store it in a location in memory, check the parity and write it out to another peripheral device. Note that the Zilog component set includes the CPU and various general purpose I/O device controllers, while a wide range of memory devices may be used from any source. Thus, all required components can be connected together in a very simple manner with virtually no other external logic. The user's effort then becomes primarily one of software development. That is, the user can concentrate on describing his problem and translating it into a series of instructions that can be loaded into the microcomputer memory. Zilog is dedicated to making this step of software generation as simple as possible. A good example of this is our assembly language in which a simple mnemonic is used to represent every instruction that the CPU can perform. This language is self documenting in such a way that from the mnemonic the user can understand exactly what the instruction is doing without constantly checking back to a complex cross listing.

FIG. 1 shows a block diagram of the CPU, showing all of its major elements (digital devices).

CPU REGISTERS

Figure 2:
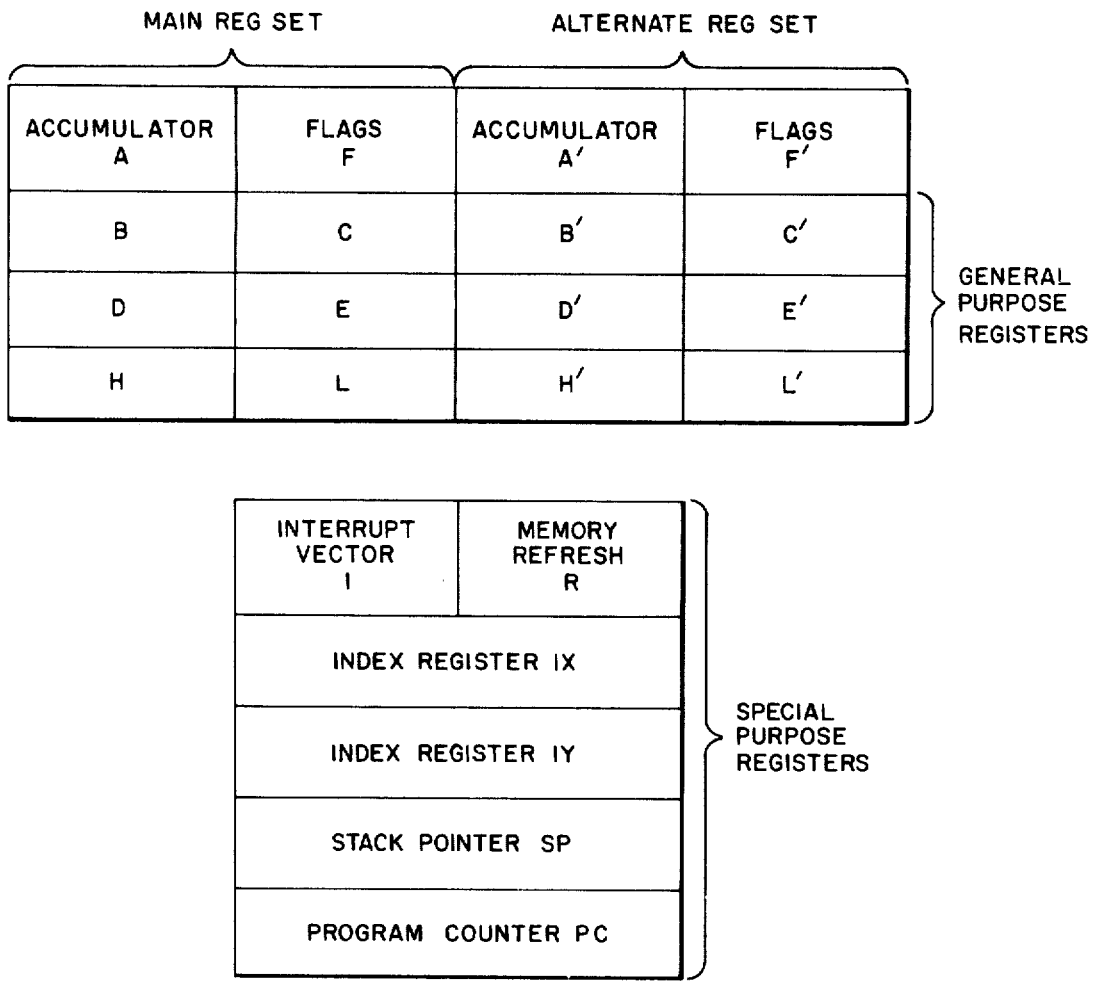
FIG. 2 is an exemplary arrangement of the register configuration of a CPU according to one embodiment of the present invention.

The Z-80 CPU contains 208 bits of R/W memory that are accessible to the programmer. FIG. 2 illustrates how this memory is configured into eighteen 8-bit registers and four 16-bit registers. All Z-80registers are implemented using static RAM. The registers include two sets of six general purpose registers that may be used individually as 8-bit registers or in pairs as 16-bit registers. These are also two sets of accumulator and flag registers.

Special Purpose Registers

1. Program Counter (PC). The program counter holds the 16-bit address of the current instruction being fetched from memory. The PC is automatically incremented after its contents have been transferred to the address lines. When a program jump occurs the new value is automatically placed in the PC, overriding the incrementer.
2. Stack Pointer (SP). The stack pointer holds the 16-bit address of the current top of a stack located anywhere in external system RAM memory. The external stack memory is organized as a last-in first-out (LIFO) file. Data can be pushed onto the stack from specific CPU registers or popped off of the stack into specific CPU registers through the execution of PUSII and POP instructions. The data popped from the stack is always the last data pushed onto it. The stack allows simple implementation of multiple level interrupts, unlimited subroutine nesting and simplification of many types of data manipulation.
3. Two Index Registers (IX & IY). The two independent index registers hold a 16-bit base address that is used in indexed addressing modes. In this mode, an index registers is used as a base to point to a region in memory from which data is to be stored or retrieved. An additional byte is included in indexed instructions to specify a displacement from this base. This displacement is specified as a two's complement signed integer. This mode of addressing greatly simplifies many types of programs, especially where tables of data are used.
4. Interrupt Page Address Register (I). The Z-80 CPU can be operated in a mode where an indirect call to any memory location can be achieved in response to an interrupt. The I Register is used for this purpose to store the high order 8-bits of the indirect address while the interrupting device provides the lower 8-bits of the address. This feature allows interrupt routines to be dynamically located anywhere in memory with absolute minimal access time to the routine.
5. Memory Refresh Register (R). The Z-80 CPU contains a memory refresh counter to enable dynamic memories to be used with the same ease as static memories. This 7-bit register is automatically incremented after each instruction fetch. The data in the refresh counter is sent out on the lower portion of the address bus along with a refresh control signal while the CPU is decoding and executing the fetched instruction. This mode of refresh is totally transparent to the programmer and does not slow down the CPU operation. The programmer can load the R register for testing purposes, but this register is normally not used by the programmer.

Accumulator and Flag Registers

The CPU includes two independent 8-bit accumulators and associated 8-bit flag registers. The accumulator holds the results of 8-bit arithmetic or logical operations while the flag register indicates specific conditions for 8 or 16-bit operations, such as indicating whether or not the result of an operation is equal to zero. The programmer selects the accumulator and flag pair that he wishes to work with with a single exchange instruction so that he may easily work with either pair.

General Purpose Registers

There are two matched sets of general purpose registers, each set containing six 8-bit registers that may be used individually as 8-bit registers or as 16-bit register pairs by the programmer. One set is called BC, DE and III while the complementary set is called BC', DE' and III'. At any one time the programmer can select either set of registers to work with through a single exchange command for the entire set. In systems where last interrupt response is required, one set of general purpose registers and an accumulator/flag register may be reserved for handling this very last routine. Only a simple exchange commands need be executed to go between the routines. This greatly reduces interrupt service time by eliminating the requirement for saving and retrieving register contents in the external stack during interrupt or subroutine processing. These general purpose registers are used for a wide range of applications by the programmer. They also simplify programming, especially in ROM based systems where little external read/write memory is available.

ARITHMETIC & LOGIC UNIT (ALU)

The 8-bit arithmetic and logical instructions of the CPU are executed in the ALU. Internally the ALU communicates with the registers and the external data bus on the internal data bus. The type of functions performed by the ALU include:

| Add | Left or right shifts or rotates (arithmetic and logical |
|---|---|
| Subtract | Increment |
| Logical AND | Decrement |
| Logical OR | Set bit |
| Logical Exclusive OR | Reset bit |
| Compare | Test bit |

INSTRUCTION REGISTER AND CPU CONTROL

As each instruction is fetched from memory, it is placed in the instruction register and decoded. The control sections performs this function and then generates and supplies all of the control signals necessary to read or write data from or to the registers, control the ALU and provide all required external control signals.

Figure 3:
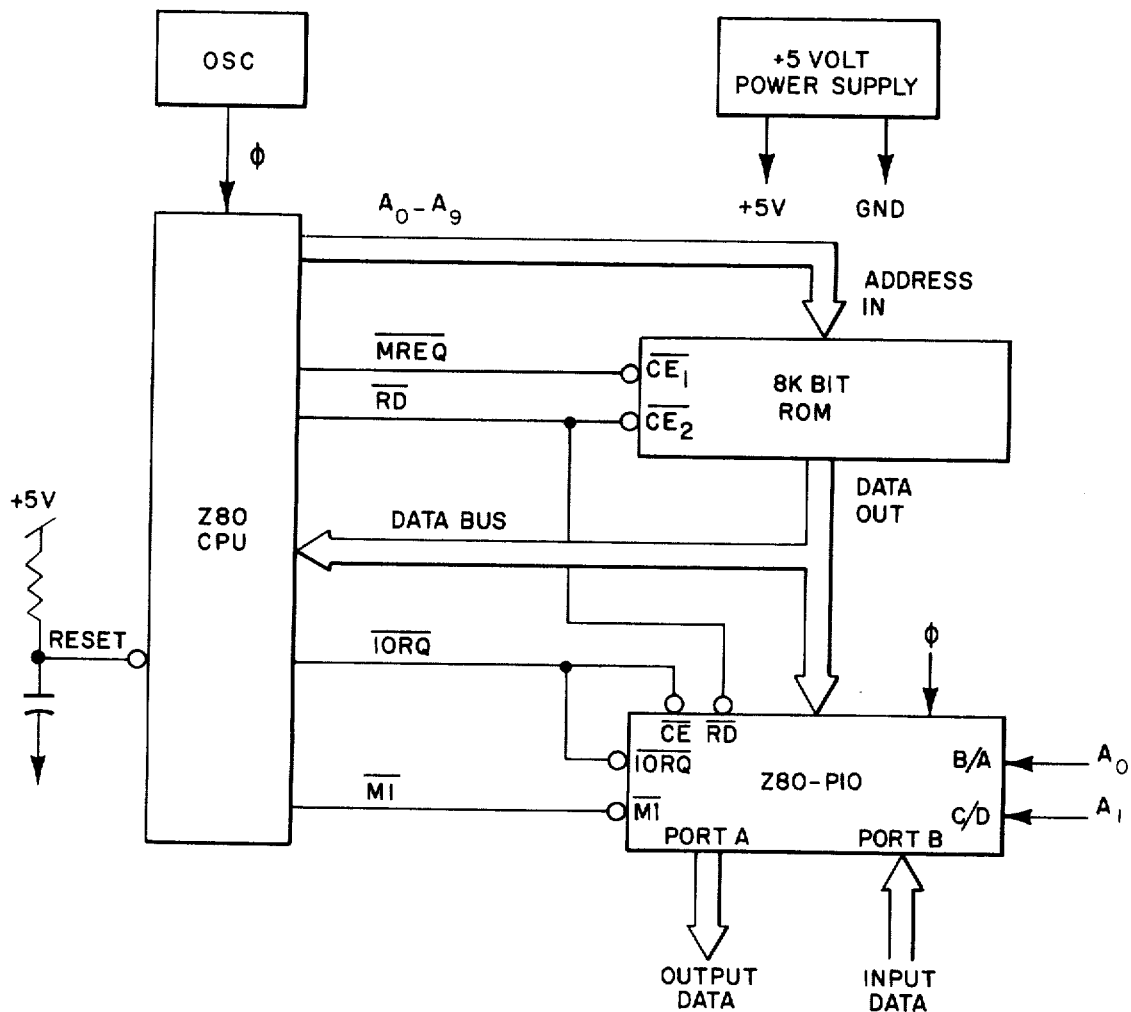
FIG. 3 is an exemplary arrangement of a minimum computer system.

FIG. 3 shows a block diagram of a very simple digital processor system using the CPU. In a practical system the following five elements are required: power supply, oscillator (a source of clock signals), memory devices, I/O circuits, and the CPU.

Since the Z80-CPU only requires a single 5 volt supply, most small systems can be implemented using only this single supply.

The oscillator can be very simple since the only requirement is that it be a 5 volt square wave. For systems not running at full speed, a simple RC oscillator can be used. When the CPU is operated near the highest possible frequency, a crystal oscillator is generally required because the system timing will not tolerate the drift or jitter that an RC network will generate. A crystal oscillator can be made from inverters and a few discrete components or monolithic circuits are widely available.

The external memory can be any mixture of standard RAM, ROM, or PROM. In this simple example we have shown a single 8K bit ROM (1K bytes) being utilized as the entire memory system. For this example we have assumed that the Z-80 internal register configuration contains sufficient Read/Write storage so that external RAM memory is not required.

Every computer system requires I/O circuits to allow it to interface to the "read world." In this simple example it is assumed that the output is an 8 bit control vector and the input is an 8 bit status word. The input data could be gated onto the data bus using any standard tri-state driver while the output data could be latched with any type of standard TTL latch. For this example we have used a Z80-PIO for the I/O circuit. This single circuit attaches to the data bus as shown and provides the required 16 bits of TTL compatible I/O. (Refer to the Z80-PIO manual for details on the operation of this circuit.) Notice in this example that with only three LSI circuits, a simple oscillator and a single 5 volt power supply, a powerful computer has been implemented.

ADDING RAM

Figure 4:
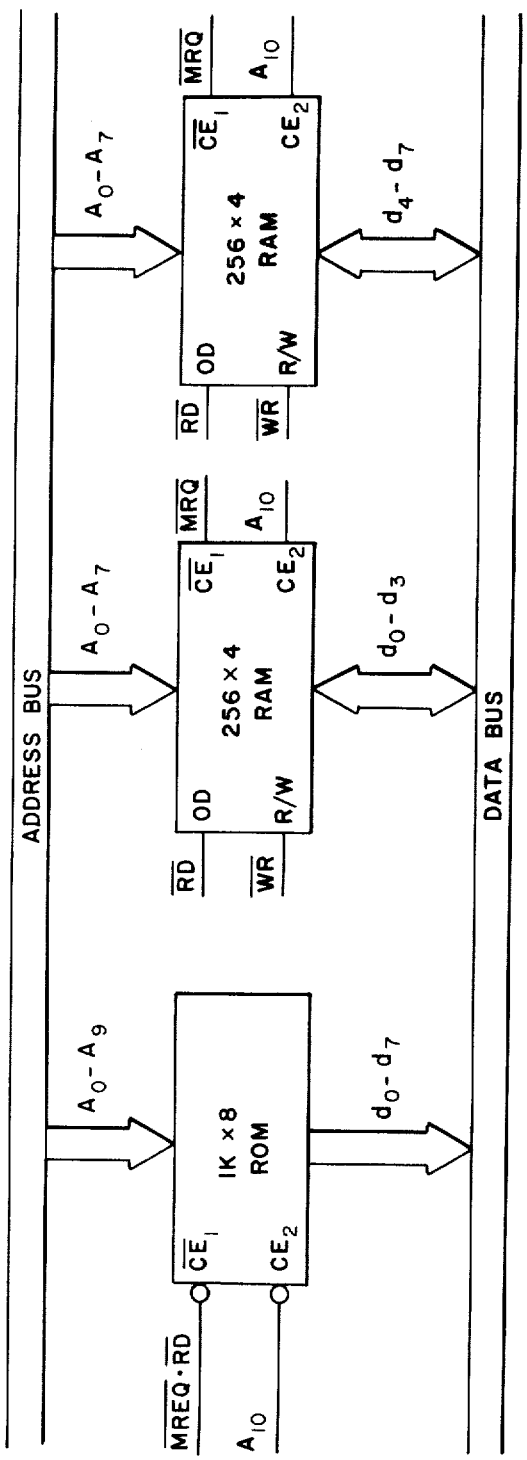
FIG. 4 is an exemplary arrangement of memory blocks forming a portion of a computer system.

Most computer systems require some amount of external Read/Write memory for data storage and to implement a "stack." FIG. 4 illustrates how 256 bytes of static memory can be added to the previous example. In this example the memory space is assumed to be organized as follows:

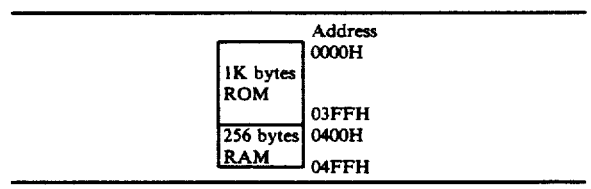

In this diagram the address space is described in hexidecimal notation. For this example, address bit $A_{10}$ separates the ROM space from the RAM space so that it can be used for the chip select function. For larger amounts of external ROM or RAM, a simple TTL decoder will be required to form the chip selects.

CPU TIMING

The Z-80 CPU executes instructions by stepping through a very precise set of a few basic operations. These include:

Memory read or write
I/O device read or write
Interrupt acknowledge

Figure 5:
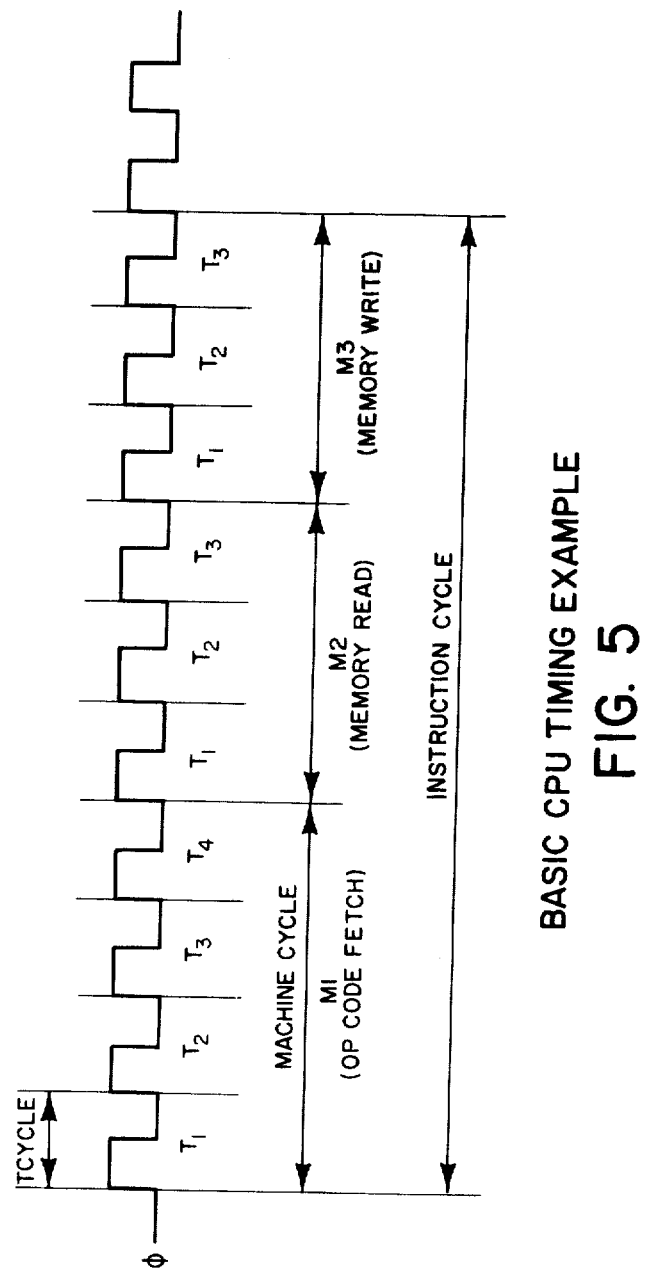
FIG. 5 is an exemplary basic timing diagram of a CPU according to one embodiment of the present invention.

All instructions are merely a series of these basic operations. Each of these basic operations can take from three to six clock periods to complete or they can be lengthened to synchronize the CPU to the speed of external devices. The basic clock periods are referred to as T cycles and the basic operations are referred to as M (for machine) cycles. FIG. 5 illustrates how a typical instruction will be merely a series of specific M and T cycles. Notice that this instruction consists of three machine cycles (M1, M2 and M3). The first machine cycle of any instruction is a fetch cycle which is four, five or six T cycles long (unless lengthened by the wait signal which will be fully described in the next section). The fetch cycle (M1) is used to fetch the OP code of the next instruction to be executed. Subsequent machine cycles move data between the CPU and memory or I/O devices and they may have anywhere from three to five T cycles (again they may be lengthened by wait states to synchronize the external devices to the CPU). The following paragraphs describe the timing which occurs within any of the basic machine cycles. In section 10, the exact timing for each instruction is specified.

The CPU of the present invention is particularly useful in a hardware/software development system. Such systems, typically employing microprocessors, have heretofore required two or more CPU's thus requiring additional logic and memory space at greatly added cost.

Figure 6:
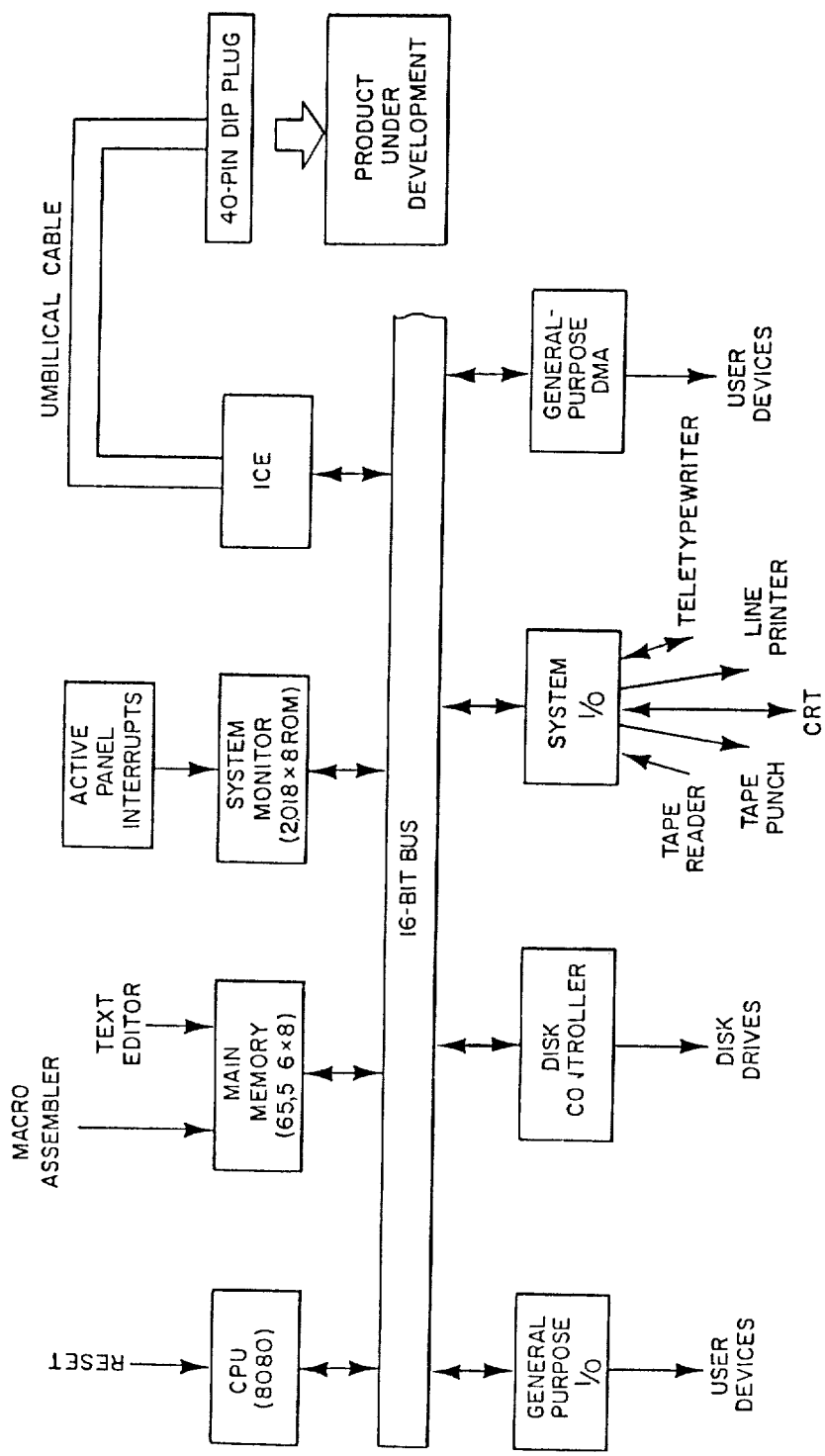
FIG. 6 is a block diagram of a prior art microprocessor hardware/software development system.
Figure 7:
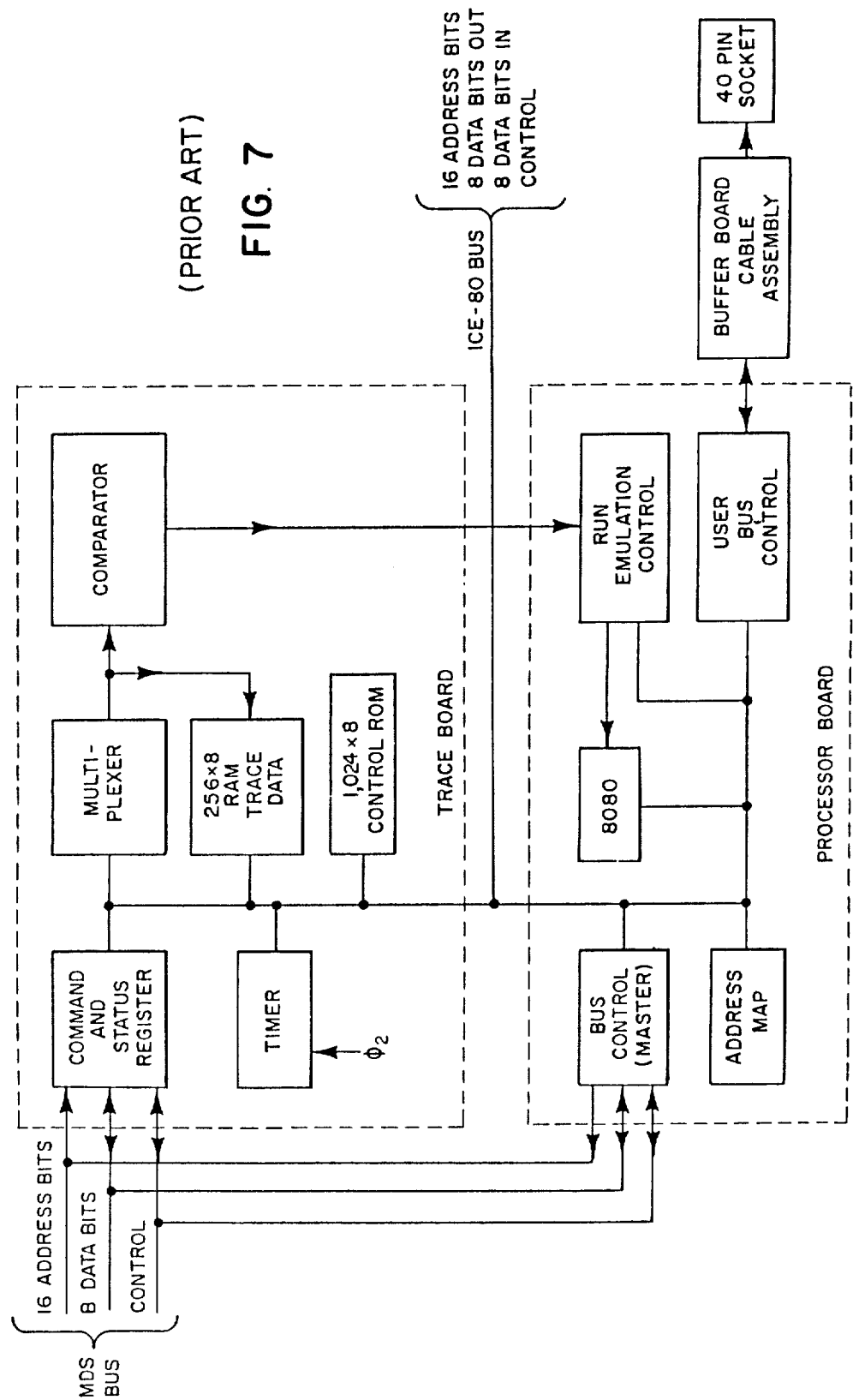
FIG. 7 is a block diagram of the ICE block of FIG. 6.

One such prior art microprocessor development system is shown in FIG. 6, wherein the block labeled ICE contains a second CPU. FIG. 7 shows the ICE block in greater detail. The additional memory space required by a second CPU is apparent from the memory allocation of such a system in FIG. 8.

Figure 8:
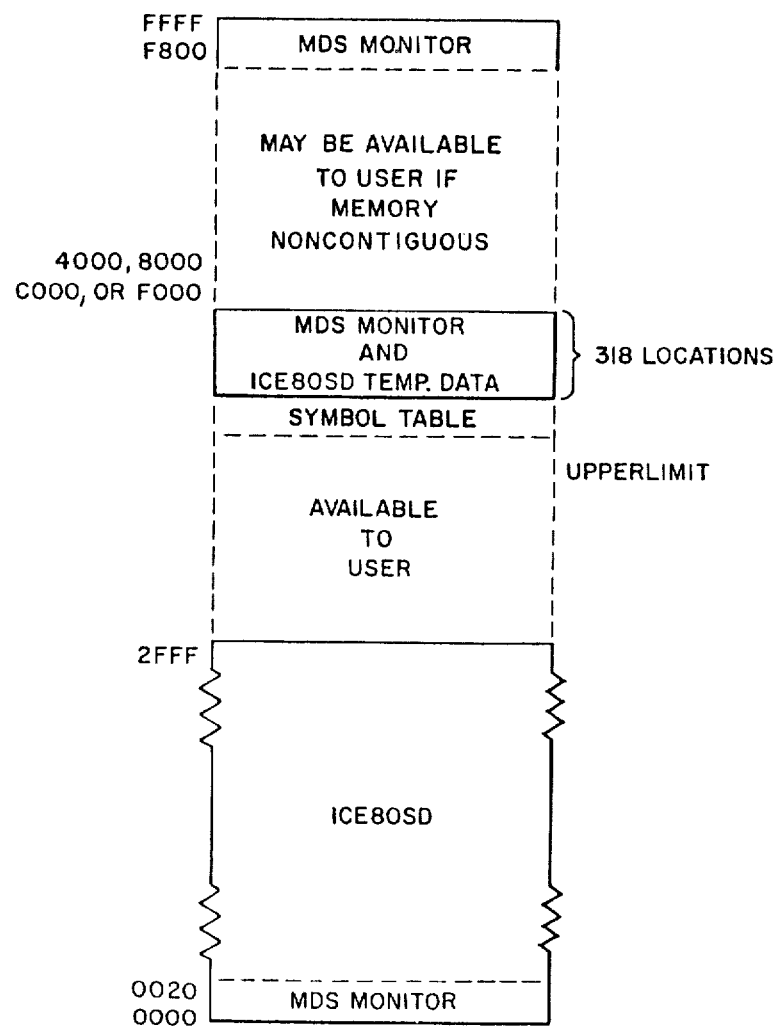
FIG. 8 is a diagram showing the organization of the memory of the system of FIG. 6.

The prior art system of FIGS. 6, 7 and 8 is described by its manufacturer, Intel, as follows.

The Intellec Microcomputer Development System (MDS) has been designed to satisfy the combined needs of the prototype equipment programmer/engineer. The system can compose programs, emulate the central processor (CPU), memory, and input/output (I/O) subsystems of a product in development, and automate hardware/software debugging operations. The programer needs no separate software environment, such as simulation with a time-shared computer; the engineer needs no laboratory model equipped with specially-built diagnostic aids. Product designers can debug their systems with prototypes that operate in the same environment as the production model.

The Intellec MDS can be adapted to work with a variety of microprocessors and in actuality consists of two systems: a basic facility that controls a general-purpose set of development resources and a specialized In-Circuit Emulator (ICE) that tailors programming, emulation, and diagnostic functions to a particular class of microcomputers. A block diagram of the Intellec MDS with an ICE module installed is shown in FIG. 6.

As can be seen from this figure, the Intellec MDS is a multiprocessor-oriented system with a variety of bus-organized subsystems including:

A general-purpose Intel 8080 CPU module, which supervises the overall system;

A main memory with a capacity of 65,536 8-bit bytes of random-access (RAM) and read-only (ROM) memory;

Interface subsystems and software to control six standard peripheral devices (including the Universal Programmable-ROM (PROM) Processor).

A diskette (floppy disk) with operating-system software;

Direct-memory-access (DMA) channels;

A bus-oriented logic subsystem designed to organize the data transfer and interruption activities of as many as nine modules (such as the CPU, DMA, and ICE);

A ROM-resident system monitor;

RAM-resident character-oriented text editor and 8080 macroassembler.

IN-CIRCUIT EMULATOR

The ICE module permits a user to build his system with no auxiliary hardware or software test equipment requirement. Instead, he uses the Intellec MDS to control and monitor the execution of his system. Thus his prototype system also becomes his production system.

To the user's system, the In-Circuit Emulator looks like a replacement for his CPU chip. Specifically, the ICE-80 module looks like a replacement for a user's 8080 CPU chip. It plugs into the user's system in place of his CPU and performs all the functions of that CPU. The other end of the ICE module connects to the Intellec MDS where it interacts with the MDS software.

ICE-80 allows the user to test his system even though it is not completely built. Some or all of the storage of the user's system can be contained in Intellec MDS memory during system development. Similarly, some or all of the user's periherals can be the standard peripherals attached to the MDS system. Whenever the emulator system makes a memory or I/O access, it first consults an address map to determine the physical location of a logical memory address or I/O port.

Ice-80 can also be used as a diagnostic tool with the MDS even when the user plans to build no hardware. For example, it can be used to debug software residing in the MDS.

A block diagram of the ICE-80 hardware is shown in FIG. 7. Note that ICE-80 is a second processor in the MDS. Both processors operate simultaneously and communicate with each other over the MDS bus shown in this figure. ICE-80 communicates with the user's system by connecting directly into the user's system bus in place of the user's 8080 CPU (via the 40-pin socket). Finally, the emulator communicates with its own system components over the internal ICE-80 bus.

The ICE-80 module is a complete microcomputer system on two cards as shown in FIG. 7. The processor card has four primary functions:

Housing the 8080 chip that replaces the user's CPU;
Controlling the user and MDS buses;
Address mapping;
Starting/stopping the emulation process.

The trace card of the ICE-80 module also performs four main functions:

Accepting commands from the MDS;
Controlling internal operation of the ICE-80;
Collecting data for each machine cycle of an emulation for later transfer to a control block in MDS memory;
Comparator control for breaking emulation under specific conditions.

The ICE-80's 8080 CPU performs three tasks alternately. One task is to execute the functions of the user's system (emulation) in real-time mode; the second allows emulation of the user's system in single or multiple-step mode; the third is to communicate with the MDS monitor (interrogation). ICE-80 switches from emulation to interrogation whenever a breakpoint condition is satisfied.

Whenever a transition occurs from the emulation to the interrogation function, the state of the user's system must be saved (in an area of MDS memory called a control block) and then restored on the opposite transition. Data in the control block remains available to the ICE-80 software driver (ICE80SD). The run emulation control logic on the ICE-80 processor card directs these transitions.

When the emulation task is being performed, the ICE-80 CPU is executing the user's program. During interrogation, a program stored in the 1K ROM on the ICE-80 trace card controls ICE-80 actions.

Finally, while the ICE-80 system is emulating the user's system, it is also circularly storing information describing each cycle it executes into the trace card's 256-byte RAM. At the time ICE-80 switches to the interrogation task, this RAM contains a complete description of the last 44 cycles executed during emulation. When the switch occurs, the RAM's contents are transferred to the control block set up in MDS memory. The user can not only obtain complete details about these 44 cycles during interrogation, but can also request information about logic levels on 8080 control lines, on the amount of time elapsed during the last emulation, and can read from or write into any register, memory address, I/O port, or indicator flag in his system.

The user interacts with ICE-80 through a command language described in detail in Section 3. The ICE-80 software driver (ICE80SD) recognizes a set of debug commands from the user and in turn issues instructions to the ICE-80 hardware. The user's commands consist of English-like sentences comparable to high-level programming language statements. The commands provide for accessing the machine both on a high level (for debugging PL/M and assembly language programs) and on the actual machine level (for troubleshooting the user's hardware).

ADDRESS MAPPING

The address map component on the ICE-80's processor card specifies the location of user memory and I/O space in the user's program.

Memory Usage

Memory Mapping

The memory for the user's system can be in the design system itself or in MDS memory, or split between the two. Logical addresses in the user's program range from 0-65,535 and are partitioned into 16 logical blocks of 4K bytes. Each logical block can physically reside in the user's system or in any unused 4K block of memory in the MDS. If the block is physically located in the MDS, the address map specifies which 4K block of random-access memory in the MDS corresponds to this logical block.

Memory Availability

When specifying the physical location of each logical memory block, the user should be aware of the memory requirements of the MDS monitor and ICE80SD (FIG. 1-3). ICE80SD uses the first 12K of MDS memory (three logical blocks). The MDS monitor reserves the upper 2K memory locations for a 2048 by 8-bit ROM containing the monitor itself. The MDS monitor and ICE80SD also reserve the 318 locations at the top of the uppermost contiguous block of RAM.

The user's symbol table, if any, is loaded just below the 318-location reserved area. The length of this symbol table is variable, but the first location available to the user below this area can be found in a pseudo double register named UPPERLIMIT.

The main point for the user to realize is that his high-memory requirments can conflict with MDS monitor requirements and that he must map his memory accordingly.

I/O Port Mapping

The logical I/O ports employed by the user's system can be physically located in his system or in the MDS, or split between them. Logical I/O ports range from 0 to 255 and are partitioned into 16 blocks of 16 ports each.

PRODUCT DEVELOPMENT SEQUENCE

The interaction between the designer of a new product, the Intellec MDS, and the ICE-80 module can be summarized in the following typical productdevelopment sequence:

1. User completes system-design specification and initial software/hardware design.
2. User's software is written in 8080 assembly language or PL/M and assembled/compiled on the MDS or other system.
3. Peripherals are assigned to MDS or user's equipment using MDS monitor ASSIGN command.
4. ICE-80 umbilical cable is attached to prototype equipment. ICE80SD is loaded from input device (logical device READER) into user's memory or MDS memory.
5. Prototype is exercised with the user's software and MDS/ICE commands.
6. Memory, I/O, and peripheral hardware are added to prototype system as it is debugged. Corresponding resource is "disconnected" from MDS.
7. ICE-80 umbilical cable is unplugged and replaced with user's 8080 CPU chip.

The user has never had to provide extraneous hardware or software support in the prototype to perform system diagnosis. Using MDS and ICE, the system designer can take advantage of test facilities never before available in such easily-accessible form.

Figure 9:
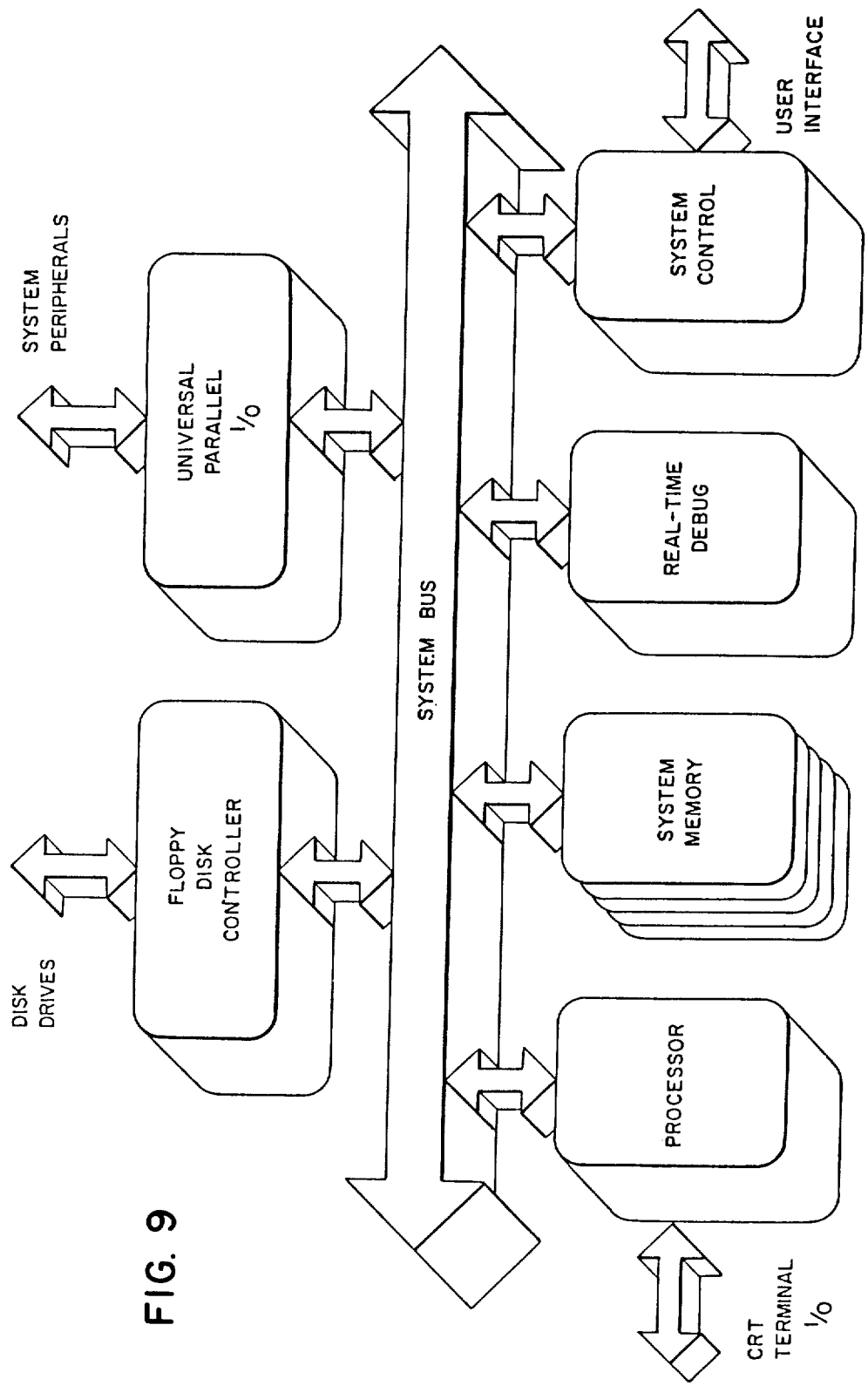
FIG. 9 is a block diagram showing the microprocessor hardware/software development system embodying the present invention.

The hardware/software development system in which the CPU of the present invention is useful is similar to that of the prior art, except that only a single CPU is required. FIG. 9 shows a block diagram of the present hardware/software development system.

Z-80 HARDWARE/SOFTWARE DEVELOPMENT SYSTEM

Introduction

The Zilog Z-80 Development System is a turn-key unit designed to support all activities associated with the creation of microprocessor based products. The floppy disk operating system, in combination with the sophisticated Real-Time Debug Module, provides performance and versatility which exceed any other microcomputer development system on the market. The use of the system allows for quicker response to market demands, less time to fully operational hardware and discovery of latent hardware or software problems before a product goes to the field.

The development system is built around the powerful Z-80 single chip microprocessor which is ideally suited to the multitask operational requirement of a development system. A single Z-80 CPU is used for both the user's hardware (User Mode) and the System resident monitor (Monitor Mode). The unique architecture of the Z-80 CPU allows the single processor to be shared between these two modes and yet perform every function that competitive designs offer while requiring 2 or 3 processors.

In the Monitor Mode the System performs as a standalone development tool wherein software programs can be entered into memory, edited, assembled and loaded for execution. This entire process is quickly performed under control of the resident disk operating system and a full complement of high speed peripheral devices through simple commands from the user's terminal.

In the User Mode all system memory and peripheral elements are dedicated to the user's own unique system, where control is switched from the ROM resident monitor to the RAM resident user's program and any external control logic if it is required. The use of RAM memory for the user's program eliminates the costly and time-consuming requirement to program PROMs.

A major feature of the Z-80 is its powerful debug module. This module allows User Mode system transactions that are designated pertinent by the user to be stored in real time into an independent memory. The user can also specify that any type of system transaction can suspend user operation and cause the system to re-enter the Monitor Mode. The complete record of all transactions preceding this suspension that were recorded in the independent memory can then be conveniently displayed on the system terminal or listed on the line printer. This ability to freeze real-time event sequences and then to review selected events in detail permit the user to accomplish product design and hardware/software debugging in the shortest possible time. Without this feature it is extremely difficult to find errors in programs or hardware where the user can not single step through a program due to real time I/O restrictions.

The standard Development System includes the following elements:
  Z-80 CPU Card
  16K Bytes of RAM Memory Expandable to 60K Bytes
  4K Bytes of ROM/RAM Monitor Software
  Real-Time Debug Module
  Floppy Disk Subsystem
  CRT Terminal and Line Printer or Hardcopy Terminal
  Standard I/O Ports for other High Speed Peripherals are available as an option
  Complete Development Software Package including:
    Z-80 Assembler Z-80 Editor
    Z-80 Disk Operating System
    Z-80 File Maintenance System
    Z-80 Debug Processor Module The Processor Module is a single card containing all elements necessary to function as a stand-alone computer. A serial I/O port is provided for operation of a teletype or CRT terminal in conjunction with up to 4K bytes of ROM resident monitor software and associated scratchpad RAM.

The ROM resident monitor software enables the user to have total operational control over the System. All system software loading is accomplished directly from the floppy disk under control of the monitor software. The need for time-consuming and inconvenient paper tape equipment has been totally eliminated in the Zilog system.

In the User Mode, System peripherals can be accessed using the monitor software drivers. This is accomplished by a unique memory overlay feature which allows the users' programs and the monitor to co-exist in the same memory locations.

Real Time Debug Module

The Zilog Development System real-time debugging capability enables the user to easily locate and correct any hardware or software design errors. With this module, the user can monitor the operation of this software in real time and also set hardware and software breakpoints to stop the program on any data, address or control bit pattern. Once stopped, the status of any internal CPU register, flag, memory location or I/O port may be monitored or changed prior to continuing the program from that point.

The Real-Time Debug Module contains a high speed memory which stores user specified system transactions for the most recent 256 events preceding a breakpoint. At the specified breakpoint, the complete history of the system for the previously executed 256 events can be dynamically traced on the system terminal. The type of history that is recorded is specified by the user. For example, all I/O writes, I/O reads, memory writes, memory reads, interrupts, or any combination of these may be included. For each such transaction, the entire contents of the data, address and control busses are stored in the memory for subsequent retrieval and display on the terminal.

An Operations Monitor is also provided to alert the user or monitor software when a program stall occurs (i.e., if the program is not executing properly or a Halt occurs). This feature is extremely valuable when program execution is dependent on the completion of external events. If a realtime event should fail to occur, the program can jump ahead, based on the status of the Operations Monitor, and warn the user that a manual corrective action is required.

System Memory

The System uses standard, readily available, 4K RAM circuits configured in 4K byte increments up to a total of 60K bytes as required by the user. System memory is shared between the two modes of operation, the Monitor Mode and the User Mode.

In the Monitor Mode, programs are entered, edited, assembled and loaded *directly* into RAM memory for immediate execution without the additional cost and time delays associated with programming PROMs.

In the User Mode, RAM memory contains the users software and the user has complete control over the system peripherals as well as full control of the system CPU.

The system is configured so that external ROM, RAM or PROM memory can be used in any combination and at any time in place of, or in conjunction with, the standard system RAM memory. This feature allows the the user to substitute his own ROM or PROM memory after the hardware configuration and software routines are finalized and user memory testing is required.

Floppy Disk Controller

This card interfaces up to four floppy disk drives in support of the Z-80 disk operating software. During initial power-up or manual system restart, programs are automatically loaded from the diskette. The ROM based monitor software contains the floppy disk software driver. Protection against data errors is provided through the use of a read before write operation as well as hardware CRC generation and parity checking.

Universal Parallel I/O Module

This module contains four Zilog parallel I/O controllers (Z80-PIO) which can control a wide range of parallel interface peripherals. The card is universal in that bidirectional data transfer and any combination of status and control lines can be accommodated under software control. It is used as an interface to the following optional system peripherals: Line Printer; Paper Tape Punch and Reader; PROM Programmer; Electronic Typewriter.

System Control Module

This card contains all elements necessary to share the system between the User and Monitor Modes. A standard hardware interconnection port and cable are also provided for simple interface between the user's hardware and the System. All lines are fully buffered and provide TTL compatible signal levels for connection to any external equipment or control logic, any portion of the user's memory system or even the user's own unique CPU card. The use of external memory and CPU cards is normally made only after all software development is complete and the user is merely checking the final design aspects of his system elements.

Also located on this card is the Counter Timer Circuit which is a Zilog component containing a sophisticated multichannel timing network. Up to four channels can be operated simultaneously to time or count internal or external events. Each channel can be set to interrupt the processor at any desired time, or on any count as determined by the program. This component enables the system to keep the track of numerous simultaneous events while only using a small fraction of the available CPU throughput capability, thus greatly simplifying hardware interfaces.

A single CPU can be used in the present system because of the novel special reset function of the CPU which permits the CPU to switch from the user (emulate) mode to the monitor (interrogation) mode without losing the user mode system state.

In response to the special reset signal, only the CPU program counter is reset to zero, whereas, in response to the normal reset signal not only is the program counter reset to zero, but the CPU is initialized by disabling the interrupt enable flip-flop, setting registers I and R to zero. Also during the normal reset time, the address bus and data bus go to a high impedance state and all control output signals go to the inactive state and the CPU timing logic is reset.

In order for the monitor mode to operate, the CPU states must be maintained as they were when the system switched from the user mode to the monitor mode. This preservation is achieved by the special reset function. The last program counter address in the user mode before switching is held by an additional register that is preferably external to the CPU. However, the designer could place the register in the CPU chip if he is willing to use the additional space that would be required.

An additional pin for the special reset is not required by establishing a special timing for the special reset: A longer pulse time is used. The same reset pin input is used and logic inside the CPU determines by the pulse length whether the signal is a normal or special reset.

Figure 10:
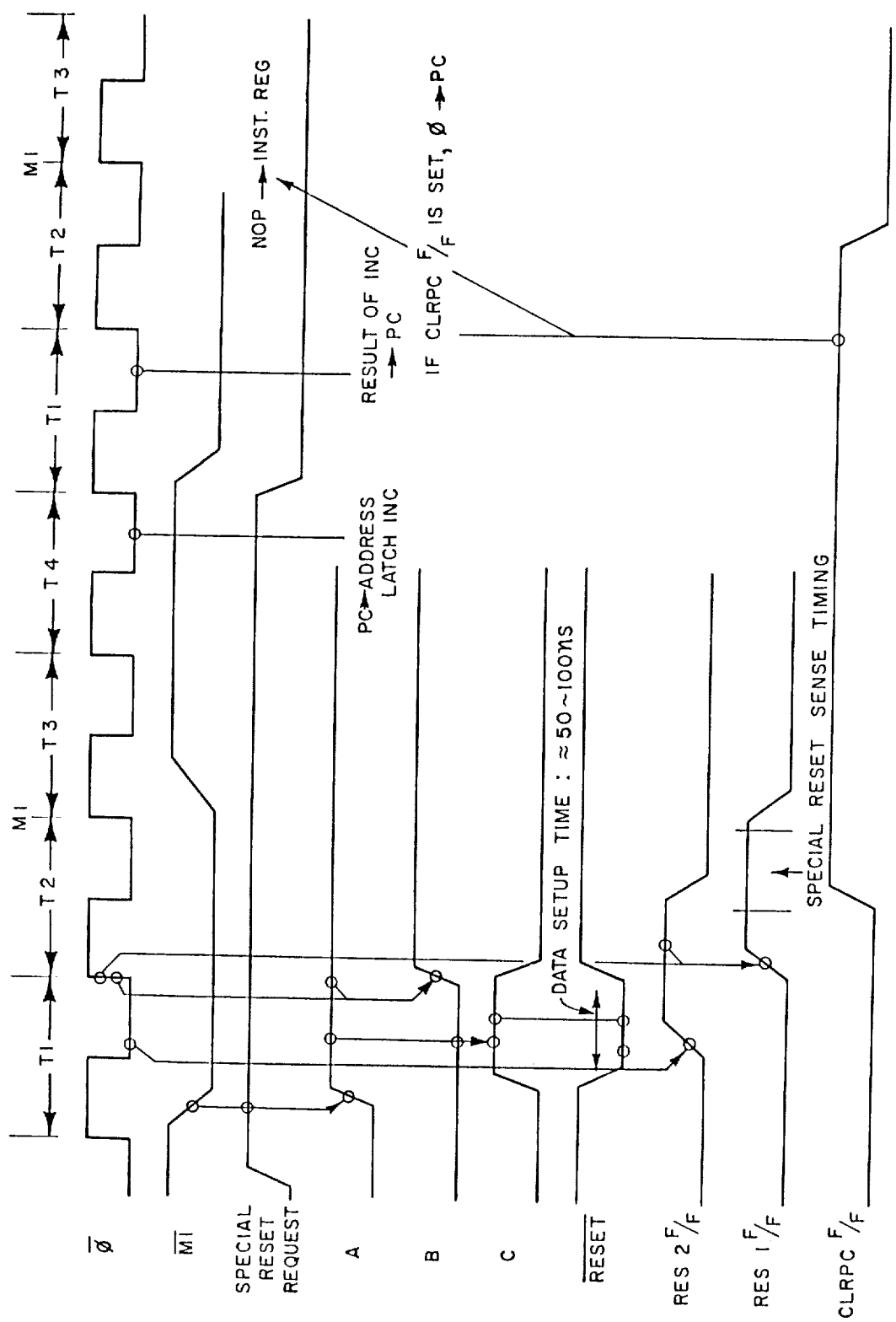
FIG. 10 is a timing diagram useful in understanding the special reset function according to the present invention.

FIG. 10 shows the CPU timing diagram for the reset and special reset signals.

Figure 11:
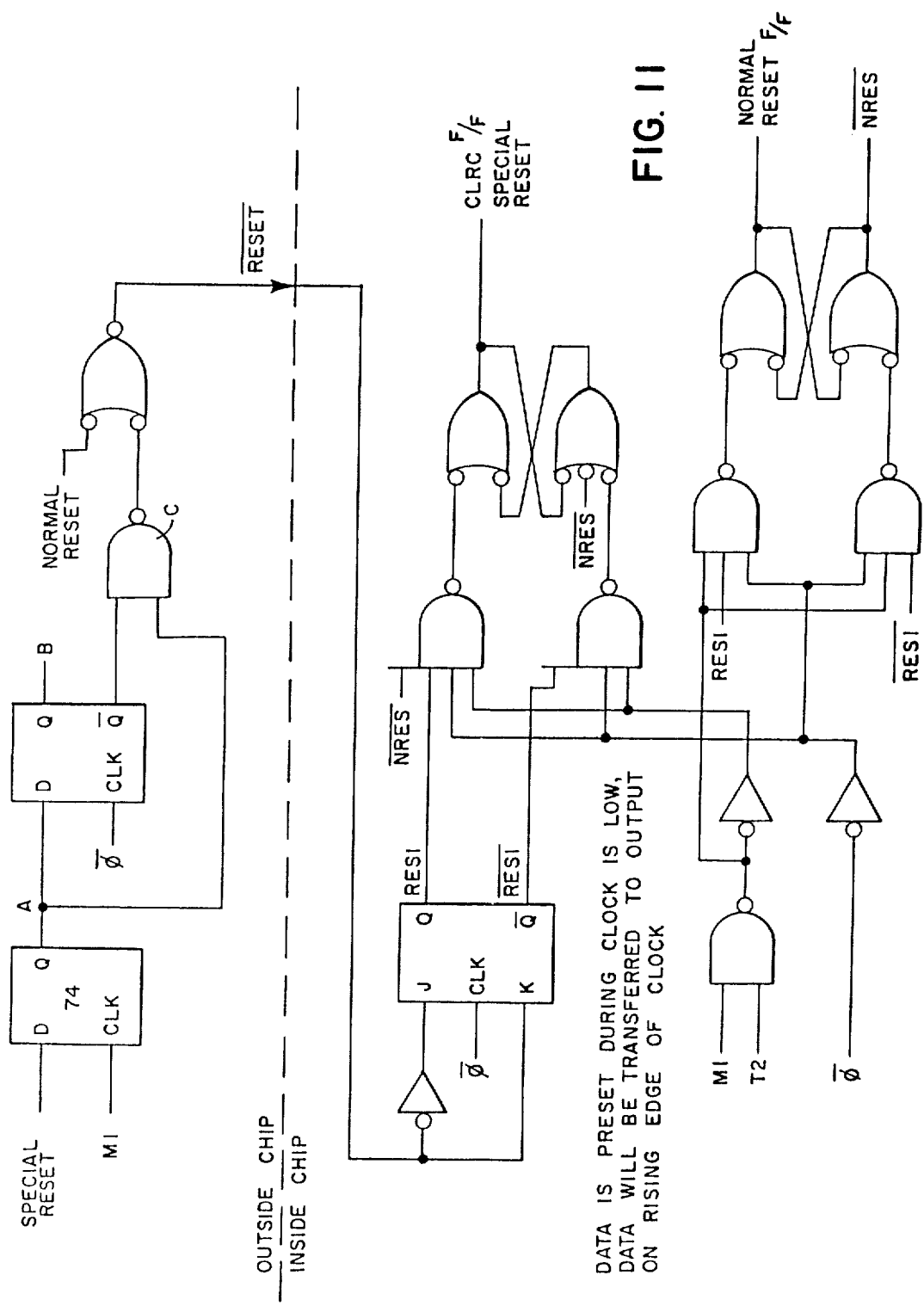
FIG. 11 is a block diagram showing the generation and recognition circuitry for the special reset signal.

FIG. 11 shows a block diagram of logic circuitry for generating the normal reset and special reset signals, which circuitry is located outside the CPU chip, and logic circuitry for recognizing the two signals and for energizing one of two lines in response to the recognition.

Figure 12A:
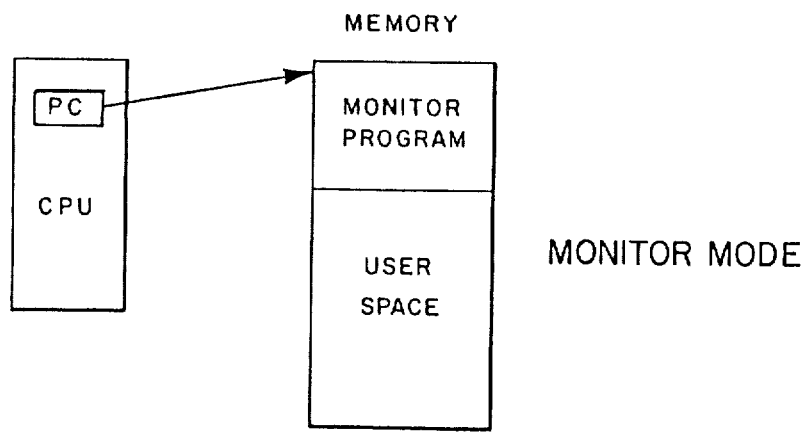
FIG. 12A is a block diagram showing the memory organization in the monitor mode of the present invention.
Figure 12B:
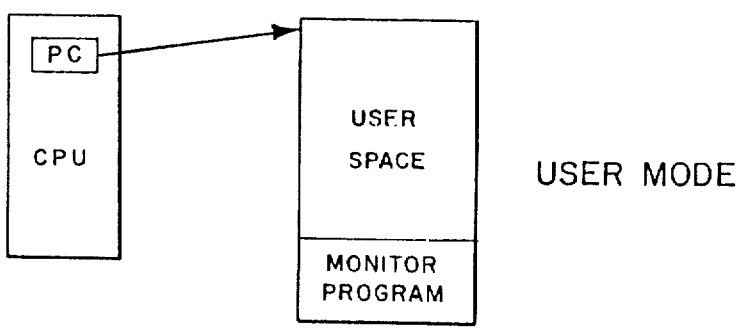
FIG. 12B is a block diagram showing the momory organization in the user mode of the present invention.

FIGS. 12A and 12B show the manner in which an associated memory is used by the CPU in the monitor and user modes, respectively. The memory is effectively "flipped" when the system changes modes. Unlike prior art systems, the user mode work space is continuous and free of additional software that additional CPU's would require.

FIG. 13 shows the manner in which an external program counter holding register is connected to the CPU. The operation of the external PC holding register is as follows:

(1) Every time the CPU fetches an instruction (while in user mode) from memory, the 16 bit CPU address bus is stored into the 16 bit holding register.

(2) When a special reset occurs, the address of the instruction trying to be fetched by the CPU is stored in the holding register but a "NOP" is forced onto the CPU data bus by the three way multiplexer. This "NOP" instruction is a "do nothing" instruction so that the CPU state is not changed. However, the holding register has now saved the program counter so that later the system can return to the execution of the user program with all CPU states unchanged.

(3) While in monitor mode, the CPU can read the 16 bit address by merely doing two normal port read commands (Read Upper Address and Read Lower Address). This data is then loaded into the CPU program counter with a simple Junip instruction and the system is now ready to resume simulation in user mode.

Throughout the present application, terminology and concepts commonly used and well-known in the digital processing and microprocessor industry have been used.

The CPU of the present invention is to be sold commercially under the designation "Zilog Z-80 CPU".

Although the present invention has been described in connection with a specific SLI CPU and associated microprocessor systems, it will be understood by those of ordinary skill in the art that the invention is applicable to other digital processing apparatus. The scope of the invention is therefore limited only by the appended claims.

We claim:

1. In a microprocessor product development system having a central processing unit and memory connected to a common bus, apparatus for using said central processor unit in both a user mode and a monitor mode while saving the user mode system state when switching to the monitor mode, comprising:

said central processor unit including address bus terminals connected to said common bus a plurality of digital logic device means, a first program counter means for storing the program address of a location of said memory, and means responsive to a clock signal for connecting the value of said program counter to said address bus terminals, and said central processor unit means further including means for resetting said first program counter means and said plurality of digital logic device means in response to a reset signal and for resetting only said first program counter means in response to a special reset signal having a different detectable characteristic from said reset signal, whereby the user mode system state is saved when said special reset signal is applied to the central processor unit to switch the system from the user mode to the monitor mode.

2. The combination of claim 1 further comprising second program counter means, and means for tracking said second counter means to said first counter means.

3. The combination of claim 2 further comprising means for inserting the contents of said second program counter means into said first program counter means.

4. The combination of claim 1 further comprising memory means for storing a monitor mode program and a user mode program, and means for addressing said monitor mode program when said system is in the monitor mode and for addressing said user mode program when said system is in the user mode.

5. The combination of claim 1 wherein said central processor unit additionally comprises a single pin through which said reset and said special reset signals are communicated to the central processing unit.

6. For a microprocessor system having a central processing unit in a single package with connecting pins and a memory that are both connected to a common bus as part of the system, said central processing unit comprising:

timing logic,
an interrupt enable device,
at least one register,
a program counter that stores the program address of a location of said memory,
means responsive to a first reset signal at a given one of said pins for resetting all of said first program counter, said at least one register, and said timing logic, and for disabling the interrupt enable device, and means responsive to a second reset signal having a characteristic distingishable from said first reset signal at said given pin for resetting said first program counter without resetting either of said at least one register or said timing logic, and without disabling said interrupt device.

7. The central processing unit of claim 6 which additionally comprises means connected to said given pin for discriminating between said first and second reset signals applied thereto on the basis of their relative durations.

* * * * *

UNITED STATES PATENT AND TRADEMARK OFFICE
CERTIFICATE OF CORRECTION

PATENT NO. : 4,486,827

DATED : Dec. 4, 1984

INVENTOR(S) : Shima et al.

It is certified that error appears in the above-identified patent and that said Letters Patent is hereby corrected as shown below:

Col. 14, line 29, insert --,-- between "bus" and "a".

Signed and Sealed this

Seventh Day of May 1985

[SEAL]

Attest:

DONALD J. QUIGG

Attesting Officer     Acting Commissioner of Patents and Trademarks